United States Patent [19]

Overholt

[11] 3,744,559

[45] July 10, 1973

[54] HEAT-TRANSFER DEVICE FOR COOLING HEAT-GENERATING COMPONENTS

[75] Inventor: Ralph E. Overhplt, Columbus, Ohio

[73] Assignee: Western Electric Company, Incorporated, New York, N.Y.

[22] Filed: Mar. 3, 1971

[21] Appl. No.: 120,661

[52] U.S. Cl. .................................................. 165/80
[51] Int. Cl. .............................................. F28f 7/00
[58] Field of Search ................................. 165/47, 80

[56] References Cited

UNITED STATES PATENTS 3,213,324 10/1965 McAdam ........................... 317/100

*Primary Examiner*—Charles Sukalo
*Attorney*—W. M. Kain, R. P. Miller and A. C. Schwarz, Jr.

[57] ABSTRACT

A heat-transfer device of unitary structure for dissipating heat generated by semiconductors and the like is composed of a heat-conducting metal. The device includes a flat base having fingers formed integrally and upwardly along longitudinal opposite edges thereof. An opening is formed in the central portion of the base to facilitate the positioning of the heat-transfer device over the accommodating structure of a semiconductor after the semiconductor has been assembled with and secured to a printing wiring board. The heat-transfer device is integrally formed with clinching tabs which are bent after the device has been assembled with the printed wiring board to secure the device with the board independently of the semiconductor.

3 Claims, 5 Drawing Figures

INVENTOR
R.E. OVERHOLT

BY J B Hoofnagle Jr.

ATTORNEY

HEAT-TRANSFER DEVICE FOR COOLING HEAT-GENERATING COMPONENTS

BACKGROUND OF THE INVENTION

1. Field of the Invention

This invention relates to a heat-transfer device for cooling heat-generating components, and particularly relates to a heat-transfer device for dissipating the heat generated by electronic components, such as semiconductors and the like.

2. Description of the Prior Art

In the environmental use of electronic components, such as transistors, rectifiers and the like, the components generate substantial amounts of heat which affect the desired operation of the components. Therefore, it is desirable to remove the heat from the area of the components as rapidly as possible to insure stable and acceptable operating conditions for the components.

In the past, heat-transfer devices have included structures which are attachable directly to the electronic components and which are shaped to facilitate the transfer of heat away from the components. In addition, other structures include devices which are attachable directly to a supporting substrate, such as a printed wiring board, with the component being mounted on the heat-transfer device. Other such devices require the attaching of the leads of the electronic components to the printed wiring board to maintain and secure the heat-transfer device with the board.

In each of the above-mentioned examples, the external structure of the electronic component is attached to the heat-transfer device in such a way that any external force directed against the heat-transfer device will probably result in damage to the electronic component. In addition, some of the above-mentioned heat-transfer devices are placed directly in engagement with the supporting substrate, such as a printed wiring board, and, therefore, limit the air flow about the portion of the device which is placed in direct engagement with the substrate. This reduces the efficiency of the heat-transfer ability of the device.

Consequently it is most desirable to have a heat transfer device which is independently attachable to a supporting structure, such as a substrate or printed wiring board, but which is positioned adjacent to the electronic component and which is mounted on the substrate in such a way that the maximum cooling benefits can be obtained.

SUMMARY OF THE INVENTION

It is, therefore, an object of this invention to provide a new and improved heat-transfer device for facilitating the cooling of heat-generating components.

Another object of this invention is the provision of a new and improved heat-transfer device which is securable to a supporting structure other than the electronic component to be cooled and independently of the component.

Still another object of this invention is the provision of a new and improved heat-transfer device which is securable to a supporting structure in such a way that air is permitted to move about a substantial portion of all surfaces of the device to obtain maximum cooling benefits from the device.

A heat-transfer device illustrating certain principles of the invention may include a heat-dissipating member formed to be positioned about a heat-generating component to facilitate the dissipation of the heat generated by the component. The member is provided with means for securing the device to a supporting structure independently of the component. The heat-dissipating member is further formed with means for spacing a major portion of the member from the supporting structure so that all major surfaces are exposed to air flow to facilitate the efficient and fast dissipation of the heat generated by the component.

BRIEF DESCRIPTION OF THE DRAWINGS

Other objects and features of the present invention will be more readily understood from the following detailed description thereof when read in conjunction with the accompanying drawings, in which.

DETAILED DESCRIPTION

Figure 1:
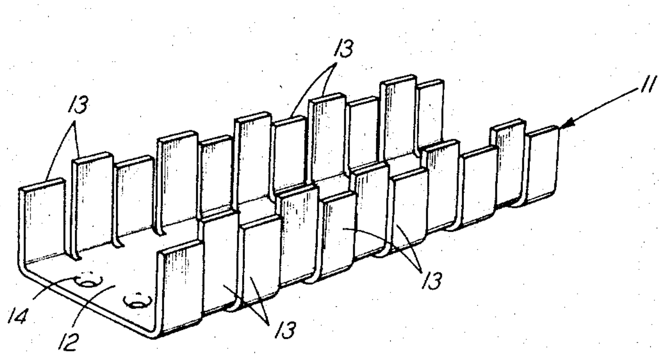
FIG. 1 is a perspective view of a heat-transfer device embodying certain principles of the invention.

Referring to FIG. 1, there is illustrated a heat-transfer device, designated generally by the numeral 11, of unitary structure which includes a heat-dissipating member of a generally U-shaped channel configuration. The member includes a flat base 12 with spaced, upturned fingers 13—13 extending from opposite spaced edges thereof. As illustrated, the fingers 13—13 of the base 12 are spaced from each other along the edge and adjacent fingers are also offset from each other. The heat-transfer device 11 is composed of a material which will dissipate heat generated in the area of the device. An example of a material which will provide satisfactory results when used as the heat-transfer device 11 is aluminum alloy 1100 with an H14 temper. Other suitable materials and compositions can be used and provide satisfactory results while employing the inventive design of the heat-transfer device 11.

Figure 2:
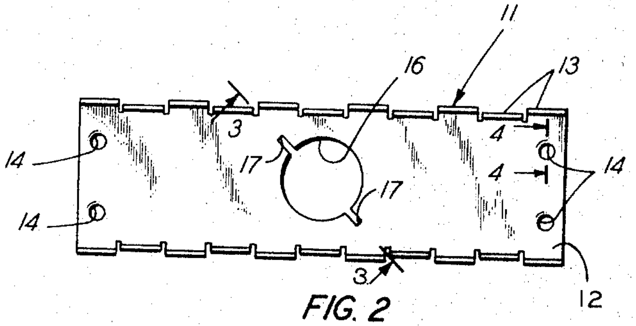
FIG. 2 is a plan view of the heat-transfer device of FIG. 1.
Figure 4:
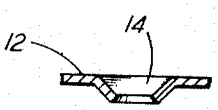
FIG. 4 is a sectional view, taken along line 4—4 of FIG. 2, showing one of several legs formed in the heat-transfer device for maintaining the device in a spaced position relative to a supporting structure.

Referring to FIG. 2, the base 12 is formed with four punched-through legs 14—14 at opposite ends thereof. The general configuration of the legs 14—14 is illustrated in FIG. 4. In addition, a central portion of the base 12 is formed with a cutout opening 16.

Figure 3:
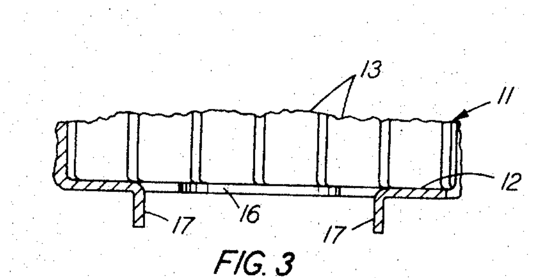
FIG. 3 is a sectional view taken along line 3—3 of FIG. 2, showing tabs formed in the heat-transfer device for facilitating the securing of the device with a supporting structure.

Referring to FIG. 3, tabs 17—17 are formed from the base 12 adjacent to the opening 16 and extend from the base in a direction opposite from the fingers 13—13.

Figure 5:
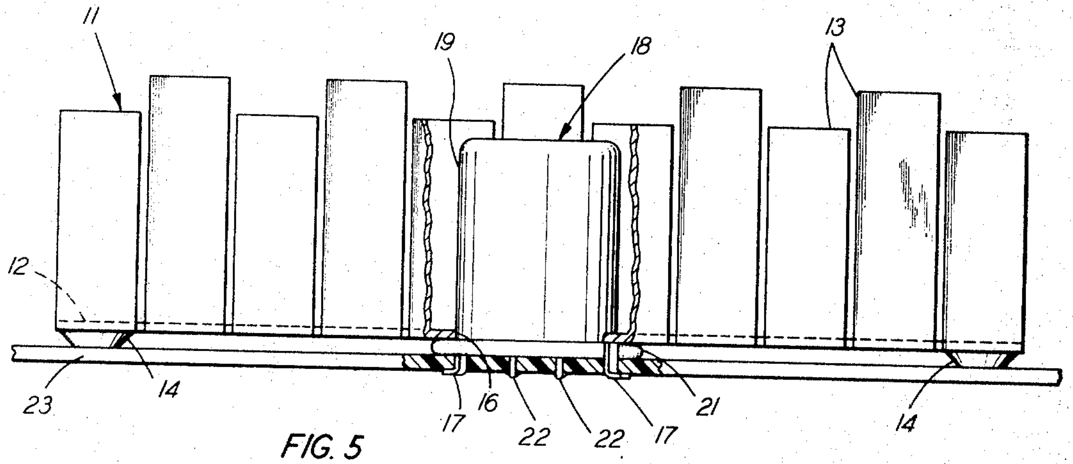
FIG. 5 is a side view with parts broken away showing an electronic component and the heat-transfer device assembled independently with a supporting structure.

Referring to FIG. 5, an electronic component, designated generally by the numeral 18, includes a can-like cover 19 which extends upwardly from an upper side of a flanged portion 21. Leads 22—22 extend from the opposite side of the flanged portion 21. The electronic component 18 is assembled and secured with a supporting structure, such as a substrate or printed wiring board 23, wherein the leads 22—22 are inserted through openings formed in the board from one side thereof and extend through and are clinched and soldered to the opposite side of the board.

After the component 18 has been assembled and secured with the board 23 in any manner, conventional or otherwise, the heat-transfer device 11 is manipulated to position the opening 16 around the can-like cover 19. The device 11 is moved toward the board 23 until the underside portion of the base 12 which is adjacent to the opening 16 is positioned over the flanged portion 21 and the legs 14—14 engage the board. In addition, as the device 11 is moved into position adjacent to the board 23, the tabs 17—17 are moved through openings in the board, extend through the board to the other side thereof and are bent as illustrated so that the heat-transfer device is clinched with the board. Thus the heat-transfer device 11 is secured to the board 23 independently of the electronic component 18, and does not provide a support or mounting in any way for the component which was priorly assembled and secured with the board in an independent operation.

As noted, the component 18 is mounted to the board 23 prior to and independently of the assembly of the heat-transfer device 11 therewith and the subsequent securing of the device with the board. This permits the component 18 to be assembled and secured with the board 23 in a conventional manner along with other components, such as resistors, capacitors and the like, wherein mass assembly facilities, such as component insertion machines, and securing techniques, such as wave-soldering devices, can be utilized. The heat-transfer device 11 can be assembled and secured with the substrate 23 and about the component 18 subsequent to the mass assembly and securing operation. It is also noted that the heat-transfer device 11 is not provided with any mounting area in which the component 18 is mounted on the device. Rather the device 11 is positioned about the component 18 and is independently securable to the substrate 23.

The legs 14–14, as illustraded in FIG. 5, provide a space between the underside of the heat-transfer device 11 and the adjacent surface of the board 23. This permits the flow of air through the space to aid in the dissipation of heat being transferred by the device 11 away from the component 18. While the particular embodiment illustrated in FIG. 5 shows the component 18 including the flanged portion 21, the heat-transfer device 11 does not depend upon the component having the flanged portion in order to maintain the space between the heat-transfer device and the board 23 for the additional air-circulating feature. For example, if the component 18 did not include thee flange 21, the legs 14—14 of the heat-transfer device 11 would still provide the space between the underside of the device and the adjacent surface of the board 23.

The legs 14—14 of the heat-transfer device 11 further prevent rocking of the device about the flanged portion 21 of the component 18, so that a substantially rigid securing of the device is accomplished which would thereby preclude damage to the component or the connection of the leads 22—22 of the component to printed wiring on the board 23.

The fingers 13—13 project upwardly from the opposite edges of the base 12 and provide a channel-like passage for air flow therethrough to further facilitate the dissipation of heat generated by the component 18. The opposite ends of the heat-transfer device 11 remain open to permit a continuous flow of air through the channel-like opening formed by the upturned fingers 13—13. The side edge portions of the fingers 13—13 provide additional surfaces for the heat-transfer device 11 to dissipate heat generated by the component 18. Further, the spacing between the side edge portions of adjacent fingers 13—13 permit the flow of air therethrough which also facilitates the rapid dissipation of the heat from the component 18.

Thus, utilization of the heat-transfer device 11 permits the independent assembly of the component 18 with the board 23 in a mass assembly and securing operation, rather than requiring a costly and time-consuming individual assembly of each component with its associated heat-transfer device which then must be subsequently secured to the board. The design of the heat-transfer device 11 with the legs 14—14 further permits air to be circulated about all major surfaces of the device. This air-circulation feature provides for an efficient and rapid dissipation of heat generated by the component 18.

The opening 16 can be formed in any configuration to accommodate mating structure of the component 18 and thereby permits readily the assembly of the heat-transfer device 11 about the component. The formation of the tabs 17—17 adjacent to the opening 16 permits the heat-transfer device 11 to provide its own securing means with which the device is secured to the board 23. Therefore, the need for additional fastening means is not required with the unitary structure of the heat-transfer device 11.

In addition, the design of the heat-transfer device 11 does not require the positioning of the leads 22—22 of the component 18 through lead holes in the device and then through holes in the board 23. Rather, the position and attachment of the leads 22—22 of the component 18 is completely independent of the heat-transfer device 11 so that no portions of the device are sandwiched between the mounting of the body portion of the component and the external attachment of the leads to external electrical circuits, such as printed wiring on the board 23. Therefore, there is no need for lead holes in the heat-transfer device 11.

I claim:

1. A heat-transfer device for dissipating heat generated by an electronic component, which comprises:

a heat-dissipating member of unitary structure composed of a heat-conductive material;

the member being formed with a base portion and upturned fingers along opposite side edges of the base portion and opposite end edges being open to form a substantially U-shaped channel which facilitates the circulation of air therethrough;

the base portion being formed with a through opening in a portion thereof with the opening being shaped generally to be positioned over a complimentary structure of an electronic component;

a pair of tabs extending integrally from a portion of the base portion adjacent said through opening for facilitating the assembly and securing of the member with a supporting structure;

the pair of tabs and the through opening in the base being located to permit the assembly of the member with the supporting structure independently of the assembly and securing of the component with the supporting structure, and the base portion being formed integrally with a plurality of legs which extend from the base portion to maintain the member in a spaced relationship with the supporting structure after securing of the member with the structure so that air is permitted to circulate about substantially all portions of the member.

2. The heat-transfer device as set forth in claim 1, wherein the pair of tabs extend in a direction generally opposite the direction of the upturned fingers.

3. The heat-transfer device as set forth in claim 1, wherein the legs extend in a direction substantially parallel to the direction of the tabs.

* * * * *